(12) United States Patent
Koo et al.

(10) Patent No.: US 7,872,876 B2
(45) Date of Patent: Jan. 18, 2011

(54) MULTI-LAYERED PRINTED CIRCUIT BOARD

(75) Inventors: Chang-Woo Koo, Seoul (KR); Jin-Sook Lee, Suwon-si (KR); Do-Hyung Kim, Yongin-si (KR); Hyun-Jung Yoo, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 943 days.

(21) Appl. No.: 11/783,508

(22) Filed: Apr. 10, 2007

(65) Prior Publication Data

US 2008/0030961 A1 Feb. 7, 2008

(30) Foreign Application Priority Data

Aug. 4, 2006 (KR) .................... 10-2006-0073670

(51) Int. Cl.
*H05K 1/11* (2006.01)
*H05K 1/14* (2006.01)

(52) U.S. Cl. ................. 361/795; 361/704; 361/710; 361/794

(58) Field of Classification Search ......... 361/700–710, 361/792–795; 174/250–253
See application file for complete search history.

(56) References Cited

U.S. PATENT DOCUMENTS 4,882,454 A * 11/1989 Peterson et al. ............. 174/252

5,831,825 A * 11/1998 Fromont ..................... 361/719
2005/0072334 A1 * 4/2005 Czubarow et al. ........... 106/270

FOREIGN PATENT DOCUMENTS

| JP | 05-283914 | 10/1993 |
|----|-----------|---------|
| JP | 11-214580 | 8/1999 |
| JP | 2001-244375 | 9/2001 |
| JP | 2003-115704 | 4/2003 |
| KR | 1020000006166 A | 1/2000 |
| KR | 1020000024837 A | 5/2000 |
| KR | 1020020035976 A | 5/2002 |

* cited by examiner

*Primary Examiner*—Tuan T Dinh
(74) *Attorney, Agent, or Firm*—Volentine & Whitt, PLLC

(57) ABSTRACT

A printed circuit board (PCB) has a multi-layered substrate including a plurality of signal lines and a ground voltage plate disposed below the signal lines and by which a common ground voltage is applied to the signal lines, a heat sink disposed on the multi-layered substrate, and thermal interface material interposed between the signal lines and the heat sink to transfer heat from the multi-layered substrate to the heat sink. The heat sink thus dissipates the heat generating from the multi-layered substrate and along with the ground voltage plate suppresses electromagnetic interference of signal transmitted through adjacent ones of the signal lines. The thermal interface material also serves in the design phase as a means to tune the impedance of the signal lines.

17 Claims, 5 Drawing Sheets

MULTI-LAYERED PRINTED CIRCUIT BOARD

BACKGROUND OF THE INVENTION

1. Field of the Invention

The present invention relates to a printed circuit board (PCB). More particularly, the present invention relates to multi-layered PCBs having strip lines and micro strip lines.

2. Description of the Related Art

Electronic devices typically include printed circuit boards (PCB) on which components that control the devices are mounted. Printed circuit boards (PCBs) are becoming smaller as the electronic devices are scaled-down to meet the demand for compact electronic devices, e.g., for portable electronic devices. Also, today's electronic devices have many functions and transmit data at high speeds. Therefore, today's PCBs are correspondingly complex.

A PCB can be classified as a single-sided PCB in which wire (circuit) patterns are formed on only one side of an insulating substrate, a dual-sided PCB in which wire (circuit) patterns are formed on both sides of an insulating substrate, and a multi-layered PCB in which wire (circuit) patterns are formed on a plurality of layers on a substrate. Single-sided PCBs were predominately used in the past because the configurations of the components and the wire (circuit) patterns connected to the components were relatively simple. However, dual-sided and multi-layered PCBs are now being widely used today because the circuitry of today's electronic devices is more complex, more highly integrated and more compact than in the past.

A multi-layered PCB has an internal structure consisting of two or more layers, an external structure consisting of two or more layers, and a synthetic resin layer, e.g., a prepreg layer, interposed between the internal and external structures. A power circuit, a ground circuit, and a signal circuit are formed on the layers of the internal structure. The synthetic resin layer insulates the internal and external structures from each other and at the same time attaches the internal and external structures to one another. The multi-layered PCB also has vias that extend through the layers, respectively. A wire (circuit) pattern on one layer is electrically connected to the wire (circuit) pattern on another layer by the vias.

Furthermore, a central processing unit or a power integration chip is typically mounted on a multi-layered PCB. Either of these components generates heat during its operation. Therefore, a heat dissipating element, namely a heat sink, is disposed over the heat-generating component on the PCB to dissipate the heat from the component.

Also, thermal interface material (TIM) having excellent thermal conductivity is interposed between the multi-layered PCB and the heat sink to transfer the heat generated by the central processing unit or power integration chip to the heat sink. The thermal interface material plays a very important role in the multi-layered PCB because components, such as semiconductor chips and transistors, will fail if the heat is not sufficiently dissipated by the heat sink. A cooling fan may also be provided to rapidly cool the heat sink.

Still further, multi-layered PCBs used in the low frequency band are affected by the shape or length of the wires of their circuit patterns. In particular, errors that occur in the circuitry and interference between signals transmitted through the wires tend to become worse as the frequency becomes higher. And with this in mind, the components to be mounted to the PCB must be laid out such that the voltage or phase, which is dependent on the disposition of the wires, and the relatively small wavelength of the signals do not create problems during operation.

Also, the signal lines of a typical multi-layered PCB must share the same ground voltage. In this respect, the ground voltage is provided by a ground voltage plate of the PCB. Therefore, an electric field can be generated between the signal lines and the ground voltage plate due to the ground voltage. However, other signal lines and components must be provided between the signal lines and the ground voltage layer. Therefore, the signal lines and the ground voltage layer present difficulties in incorporating these additional signal lines and components into the PCB.

In order to resolve the above-described problem, the ground voltage plate is disposed on the back of a dielectric substrate as facing away from the signal lines. That is, complicated wire (circuit) patterns are provided on both sides of a substrate. However, in this case, components between the signal lines and the ground voltage plate are affected by an alternating electric field characterized according to the configuration of the signal lines (conductive wiring) and the dielectric material of the substrate. The affect becomes more complicated as the frequency (Mhz) at which the PCB operates becomes higher. With this in mind, the dielectric material of the substrate interposed between the signal lines and the ground voltage plate should be perfectly uniform, and so the thickness and dielectric constant of the substrate should be perfectly uniform.

To this end, a PCB having a micro strip line was developed. In this type of PCB, a ground voltage layer is formed on a lower surface of a dielectric substrate, and signal lines are formed on the upper surface of the dielectric substrate. Therefore, the thickness and dielectric constant of the substrate are uniform. However, a PCB having a micro strip line poses problems because the ground voltage layer is provided on the lower surface of the substrate. Specifically, a PCB having a micro strip line suffers from a fringing phenomenon in which signals leak into the surrounding air and can produce undesired cross talk (in which the energy of a signal transmitted through a signal line leaks into an adjacent signal line). That is, a PCB having a micro strip line experiences significant transmission loss.

A PCB having a strip line was developed to overcome the shortcomings of the PCB having the micro strip line. In a PCB having a strip line, ground voltage plates are disposed above and below the signal lines (the wire pattern made up of the signal lines). Therefore, the signal lines are isolated and the electric field is distributed evenly across the layer of signal lines in a vertical direction (orthogonal to the PCB).

FIG. 1 is a schematic diagram of a conventional multi-layered PCB having a micro strip line. The conventional multi-layered PCB comprises a circuit board body 10, a power voltage layer 20, a first insulating plate 30, a multi-layered substrate 40, and a protective layer 50. The multi-layered substrate 40 comprises a ground voltage plate 42, a second insulating plate 44, and a plurality of signal lines 46. Three signal lines 46 are shown in FIG. 1 for the sake of clarity but four or more signal lines can be formed over the circuit board body 10.

The power voltage layer 20, the first insulating plate 30, the ground voltage plate 42, and the second insulating plate 44 are disposed on the circuit board body 10 in the foregoing order. The signal lines 46 are formed on the second insulating plate 44, and the protective layer 50 is adhered to the second insulating plate 44 and signal lines 46.

The circuit board body 10 comprises insulating material and is a multi-layered substrate of the type used for electronic packages, multi-chip modules, and computer mother boards. The power voltage layer 20 is a conductive layer for supplying electrical power to the signal lines 46.

The first insulating plate 30 is a of a dielectric material which isolates the power voltage layer 20 and the ground voltage plate 42 of the multi-layered substrate 40 from one another, and by which the power voltage layer 20 and the ground voltage plate 42 of the multi-layered substrate 40 are adhered to one another.

The multi-layered substrate 40 supports a plurality of semiconductor devices electrically connected to the signal lines 46 such that the electrical power provided by the power voltage layer 20 is transferred by the signal lines 46 to the semiconductor devices, and various other signals are transferred between the signal lines 46 and the semiconductor devices. The ground voltage layer 42 of the multi-layered substrate 40 comprises a conductive layer for grounding signal lines 46. The second insulating plate 44 has a uniform thickness and composition and is a dielectric layer which isolates the ground voltage plate 42 from the signal lines 46 and preserves the signals transmitted through the signal lines 46. The second insulating plate 44 is made of a synthetic resin, e.g., a prepreg. The thickness and dielectric constant of the second insulating plate 44 play a very important role in the transmission of signals in the multi-layered substrate 40. The protective layer 50 is a layer of photo solder resist and covers most of the multi-layered substrate 40. The protective layer 50 prevents the signal lines 46 from being oxidized, contaminated or damaged.

FIG. 2 is a schematic diagram of a conventional multi-layered PCB having a strip line. The multi-layered PCB having a strip line comprises a circuit board body 10, a power voltage layer 20, a first insulating plate 30, a multi-layered substrate 40, a third insulating plate 60, and a second ground voltage plate 70. The multi-layered substrate 40 comprises a first ground voltage plate 42, a second insulating plate 44, and a plurality of signal lines 46.

The circuit board body 10, the power voltage layer 20, the first insulating plate 30, and the multi-layer substrate 40 (i.e., the first ground voltage plate 42, the second insulating plate 44 and the signal lines 46) are similar to those of FIG. 1 and thus, will not be described in further detail.

The second ground voltage plate 70 shields the signal lines 46 from the effects of electromagnetic waves in the environment around the PCB. In addition, the second ground voltage plate 70 along with the first ground voltage plate 42 ensures that the electric field lines across the signal lines 46 are all vertical (orthogonal to the plane of the signal lines). Therefore, the second ground voltage plate 70 minimizes the leakage of the signals transmitted through the signal lines 46 into the surrounding air, and thereby ensures a stable circuit operation.

The third insulating plate 60 has a dielectric constant and a thermal conductivity which are different from those of the second insulating plate 44. The third insulating plate 60 serves to insulate the signal lines 46, attach the second ground voltage plate 70 to the second insulating plate 44 and signal lines 46, and to minimize the impedance of the signal lines 46 along with the second ground voltage plate 70.

That is, as compared to the signal lines of the PCB having a micro strip line of FIG. 1, the signal lines of the PCB of FIG. 2 (i.e., a PCB having a strip line) have low impedance. That is, signals can be transmitted with a higher fidelity and with a higher power through a multi-layered PCB having a strip line than through a corresponding multi-layered PCB having a micro-strip line. However, designing a PCB so as to have a strip line is more difficult than designing a corresponding PCB having a micro strip line.

This is because only the signal line (circuit) pattern at the uppermost layer has to be considered when designing a PCB having a micro strip line. On the other hand, it is almost impossible to obtain the desired impedance of the signal lines in a PCB having a strip line because the signal line (circuit) pattern is embedded in the dielectric of an insulating plate (the third insulating plate 60 in FIG. 2). In addition, the fabricating of a PCB having a strip line is more complicated because the signal line pattern is interposed between a pair of ground voltage plates (ground voltage plates 44 and 70 in FIG. 2). Therefore, a separate structure having the signal line (circuit) pattern should be fabricated and assembled to ground voltage plates.

The limitations of the multi-layered PCB having a strip line could be overcome by adding layers. However, the thickness of the PCB would be increased by the additional layers, the fabricating cost would be correspondingly higher, and the vias required for connecting the circuit patterns of the additional layers would compromise the signal transmission characteristics of the resulting PCB.

Of course, the width of the signal lines could be redesigned to overcome the limitations of the multi-layered PCB having a strip line. However, changes to the shape or length of the signal lines will change the impedance of the signal lines. That is, the impedance of a signal lines is dependent on the width of the signal line. In particular, the larger the width of a signal line is, the smaller the impedance. Thus, any changes to the design width of the signal lines may result in a circuit that operates abnormally, and may facilitate electro magnetic interference (EMI) in a high frequency band (resulting in poor reception), and cross talk.

SUMMARY OF THE INVENTION

An object of the present invention is to provide a PCB having a strip line structure in which the signal lines have desired impedance.

A more specific object of the present invention is to provide a thin PCB having a strip line structure in which the signal lines have desired impedance.

Another more specific object of the present invention is to provide a PCB having a strip line structure in which the signal lines have desired impedance and yet which is relatively easy and economical to fabricate.

According to one aspect of the present invention, there is provided a PCB having a strip line structure in which thermal interface material and a heat sink are attached to an outer surface of a multi-layered substrate where signal lines are disposed.

The multi-layered substrate is disposed on a circuit board body. In addition to the signal lines, the multi-layered substrate includes a ground voltage plate configured and dedicated to ground the signal lines. The signal lines are disposed on a surface of the multilayered substrate above the ground voltage plate.

According to another aspect of the invention, the heat sink is of electrically conductive material disposed on the multi-layered substrate over the signal lines. In this respect, the heat sink may consist of a plate of electrically conductive material that extends over the signal lines. Thus, the heat sink dissipates heat generated by the multi-layered substrate, and along with the ground voltage plate suppresses electromagnetic interference between signals transmitted through adjacent ones of the signal lines.

The thermal interface material is interposed between the signal lines and the heat sink so as to transfer heat from the multi-layered substrate to the heat sink. According to still another aspect of the present invention, the thermal interface material has a uniform thickness at least in the region thereof disposed over the signal lines. Therefore, the thermal interface material also spaces the heat sink and the ground voltage plate across the signal lines from one another such that the impedance of the signal lines is tuned by the thermal interface material. The thermal interface material is used to bond the heat sink to the signal lines. Preferably, the thermal interface material is a sheet of a silicon-based rubber.

The multi-layered substrate may further include a plate of electrically insulating material interposed between the ground voltage plate and the signal lines. Also, a plurality of electronic elements may be disposed on the plate of electrically insulating material and electrically connected by the signal lines. The thickness of the signal lines may be different from the thickness of the electronic elements. In this case, the thermal interface material and the heat sink extend over the electronic elements and together have a bend at a boundary between the plurality of signal lines and the plurality of electronic elements. Also, the thermal interface material may bond the heat sink to the electronic elements.

Also, the circuit board body may have a ground voltage plate. In this case, the PCB has a via electrically connecting the ground voltage plate of the circuit board body to the heat sink, a third ground voltage plate, and a fastener coupling the heat sink to the circuit board body with the third ground voltage plate and the multi-layered substrate being sandwiched between the heat sink and the circuit board body. The third ground voltage plate is disposed on the plate of electrically insulating material, is disposed in contact with the heat sink, and electrically connects the via and the heat sink.

BRIEF DESCRIPTION OF THE DRAWINGS

The above and other objects, features and advantages of the present invention will become more apparent to those of ordinary skill in the art by referring to the following detailed description of the preferred embodiments thereof with reference to the attached drawings in which.

DETAILED DESCRIPTION OF THE PREFERRED EMBODIMENTS

Figure 1:
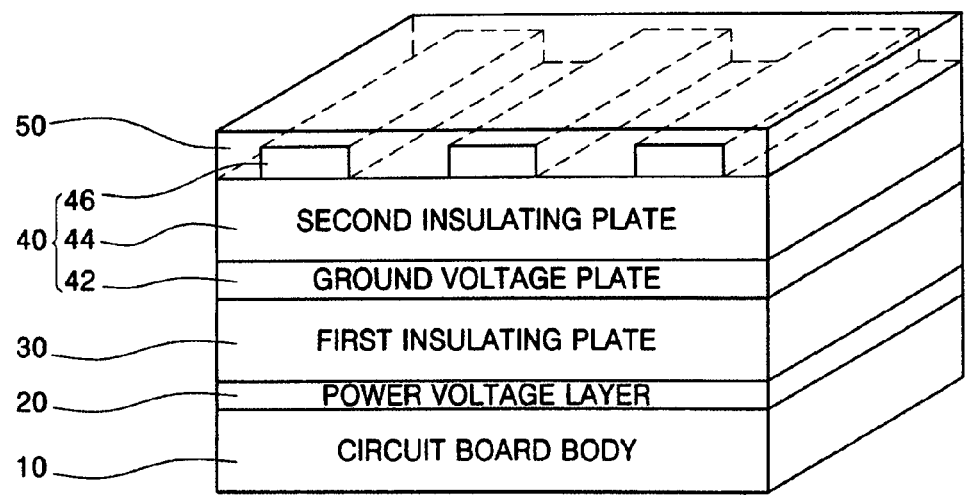
FIG. 1 is a schematic diagram of a conventional multi-layered PCB having a micro strip line.
Figure 2:
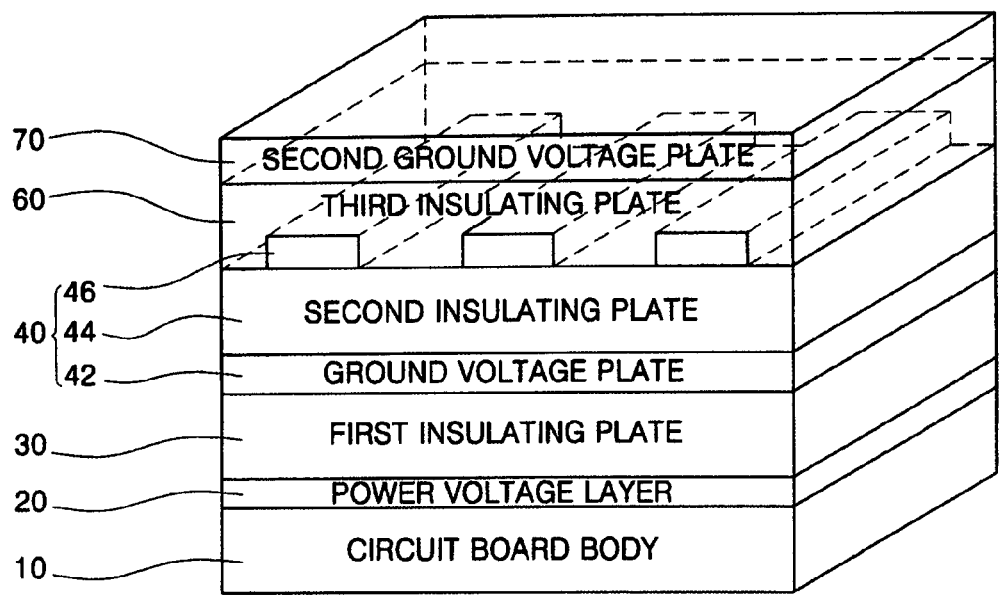
FIG. 2 is a schematic diagram of a conventional multi-layered PCB having a strip line.

The present invention will now be described more fully hereinafter with reference to FIGS. 3-5. In the drawings, the thickness of layers and regions are exaggerated for clarity. Also, like reference numbers designate like elements throughout the drawings.

Figure 3:
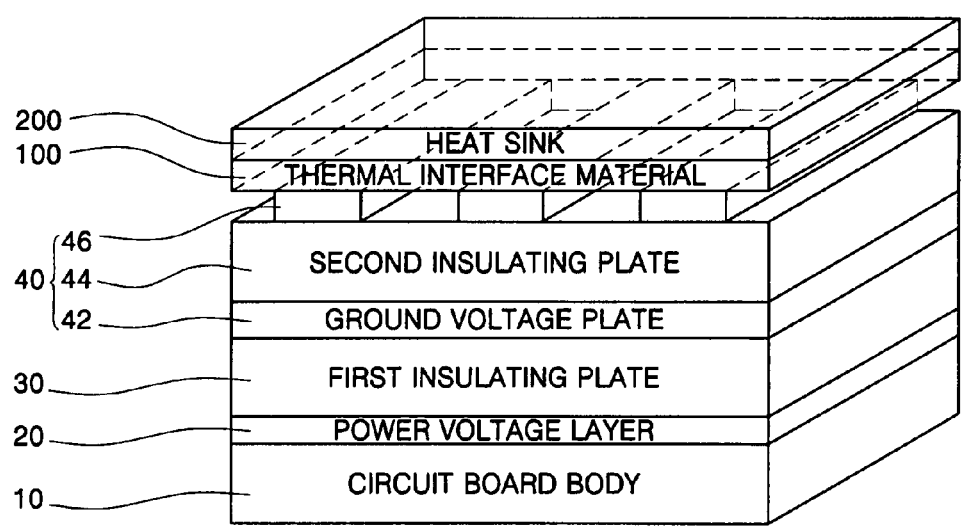
FIG. 3 is a schematic diagram of a first embodiment of a multi-layered PCB according to the present invention.

Referring to FIG. 3, a first embodiment of a multi-layered PCB according to the present invention comprises a circuit board body 10, a power voltage layer 20, a first insulating plate 30, a multi-layered substrate 40, thermal interface material 100, and a heat sink 200 attached to the thermal interface material 100. The multi-layered substrate 40 comprises a ground voltage plate 42, a second insulating plate 44, and a plurality of signal lines 46. Three signal lines 46 are shown in FIG. 3 for clarity, but four or more signal lines can extend over the circuit substrate. Also, vias connect the circuit patterns on the various layers to each other.

The circuit board body 10, the power voltage layer 20, the first insulating plate 30, and the multi-layered substrate 40 (ground voltage layer 42, the second insulating plate 44 and the signal lines 46) are similar to those of FIG. 1. Thus, these elements will not be described in further detail for the sake of brevity.

The heat sink 200 preferably consists of a solid plate of material that extends across all of the signal lines 46 and dissipates the heat generated by the signal lines 46. The heat sink 200 also serves as a ground to discharge static electricity which would otherwise build-up on the PCB, and to minimize electromagnetic interference between signals transmitted through adjacent signal lines 46.

The thermal interface material 100 has a dielectric constant and thermal conductivity different from those of the second insulating plate 44. Also, the thermal interface material 100 is a material that changes to a liquid or gel from a solid phase at a certain temperature. The thermal interface material 100 is preferably a silicon rubber-based material. The thermal interface material 100 rests on the signal lines 46 and serves to bond the heat sink 200 to the signal lines 46 while electrically insulating the signal lines 46 and transferring heat from the signal lines 46 to the heat sink 200. In addition, the thickness and/or dielectric constant of the thermal insulating material 100 can be used to establish the desired impedance of, i.e., tune the signal lines 46.

That is, the width of the signal lines 46 is not used as the design parameter for establishing the impedance of the signal lines. Rather, the design parameter for establishing the impedance of the signal lines 46 is the capacitance between the signal lines 46 and the heat sink 200 (both of which are conductors). The desired capacitance can be established easily by employing thermal interface material 100 having an appropriate thickness and/or dielectric constant. Thus, the present invention resolves the problem in the prior art pertaining to the difficulties in tuning the impedance of the signal lines to prevent such problems of EMI and undesired cross talk while at the same time maintaining stable operating characteristics of the PCB.

Moreover, electronic devices, e.g., semiconductor devices, can be damaged by a static electricity caused by an external electronic device or contact with a human body. Thus, an electro-static discharge (ESD) circuit is disposed on an input/output terminal of an internal circuit to prevent the build-up of static electricity. Specifically, the impedance of the circuit is suddenly changed to ground the static electricity when the ESD circuit detects a voltage higher than a predetermined voltage or an amount of electric current greater than a predetermined amount of current flowing through the circuit.

In the first embodiment of the present invention, the thermal interface material 100 is attached to the uppermost surface of the multi-layered substrate 40, which is an outer surface of the multi-layered PCB, and the heat sink 200 is attached to the thermal interface material 100. The heat sink 200 functions as a ground to thereby discharge static electricity. In addition, the heat sink 200 functions as a ground voltage plate. Accordingly, the heat sink 200 and the ground voltage plate 42 suppress undesired cross talk between adjacent ones of the signal lines 46. On the other hand, there may be some instances in which cross talk is desired. For example, a coupler distributes electric power to an internal circuit, and a filter extracts electrical power of a predetermined filter, by means of cross talk. In these cases, the present invention allows the signal lines to be spaced relatively close together to facilitate cross talk. Thus, in a case in which the present invention is employed in a chip in which cross talk is desired, the chip can be very small.

Figure 4:
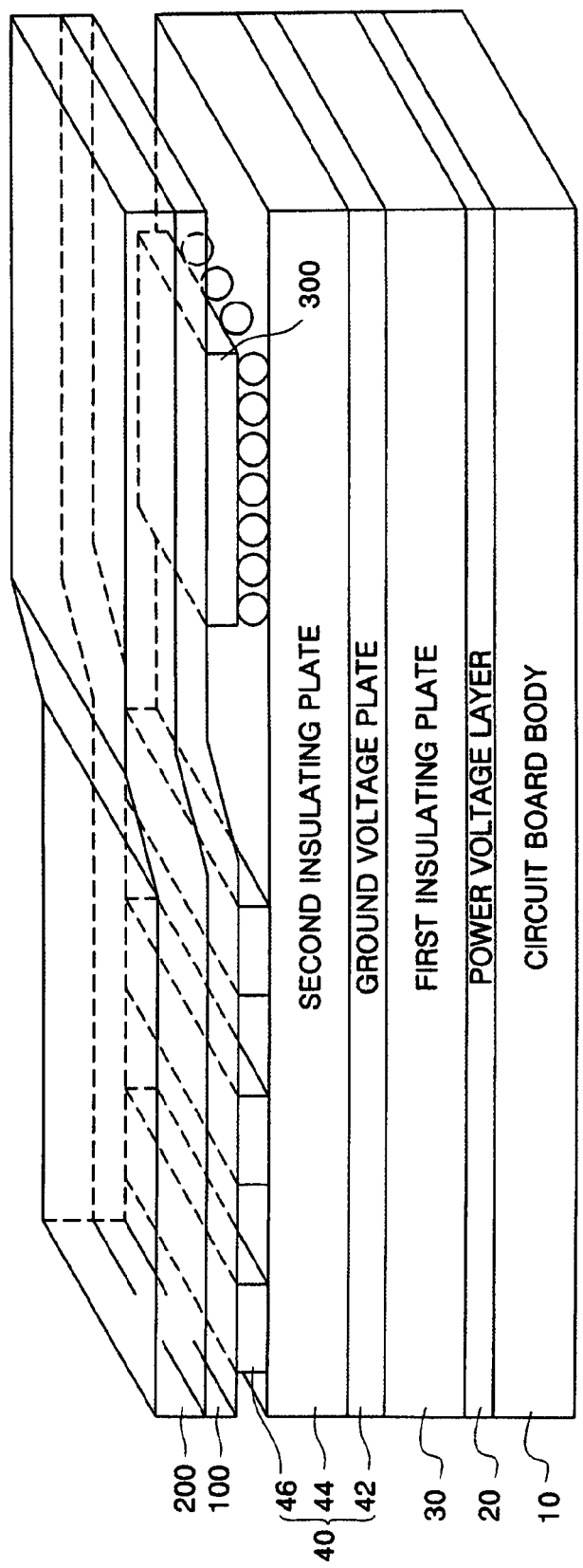
FIG. 4 is a schematic diagram of a second embodiment of a multi-layered PCB according to the present invention.

FIG. 4 illustrates a second embodiment of a multi-layered PCB according to the present invention. The multi-layered PCB of FIG. 4 comprises a circuit board body 10, a power voltage layer 20, a first insulating plate 30, a multi-layered substrate 40, a plurality of active electronic elements 300, thermal interface material 100, and a heat sink 200. The multi-layered substrate 40 comprises a ground voltage plate 42, a second insulating plate 44, and a plurality of signal lines 46.

The circuit board body 10, the power voltage layer 20, the first insulating plate 30, the multi-layered substrate 40, the thermal interface material 100, and the heat sink 200 are similar to those of the embodiment of FIG. 3. Thus, these elements will not be described in further detail for the sake of brevity. Also, three signal lines 46 and a single active element 300 are shown in FIG. 4 for the sake of clarity, but the PCB of the embodiment of FIG. 4 may have four or more signal lines 46 and has two or more active elements 300.

The circuit board body 10, the power voltage layer 20, the first insulating plate 30, the multi-layered substrate 40 (i.e., the ground voltage plate 42, the second insulating plate 44 and the signal lines 4), the thermal interface material 100, and the heat sink 200 are similar to those of FIG. 3. Therefore, these elements will not be described in further detail.

Each active element 300 is disposed on the second insulating plate 44. The thermal interface material 100 and the heat sink 200 both extend over the active elements 300 as well as the signal lines 46. Also, the thickness of the signal lines 46 is different from that of the active elements 300. Therefore, the thermal interface material 100 and the heat sink 200 have a bend at a boundary between the signal lines 46 and the active elements 300. The active elements 300 may comprise central processing units and/or integrated circuits which exchange data through the signal lines 46. In this respect, the active elements 300 may be semiconductor chips connected to the signal lines 46.

The heat generating from the active elements 300 and the signal lines 46 is dissipated by heat sink 200. And, as described above, the heat sink 200 discharges static electricity and minimizes electromagnetic interference between the signals transmitted through adjacent signal lines 46.

The thermal interference material 100 has a dielectric constant and thermal conductivity different from those of the second insulating plate 44. The thermal interface material 100 serves to bond the heat sink 200 to the signal lines 46 and active elements 300 while electrically insulating the signal lines 46 and active elements 300, and to transfer the heat generating from the signal lines 46 and active elements 300 to the heat sink 200. Also, the signal lines 46 are interposed between the heat sink 200 and the ground voltage plate 42. Thus, as described above, the thickness or dielectric constant of the thermal insulating material 100 can be used to establish the desired impedance of, i.e., tune the signal lines 46.

Figure 5:
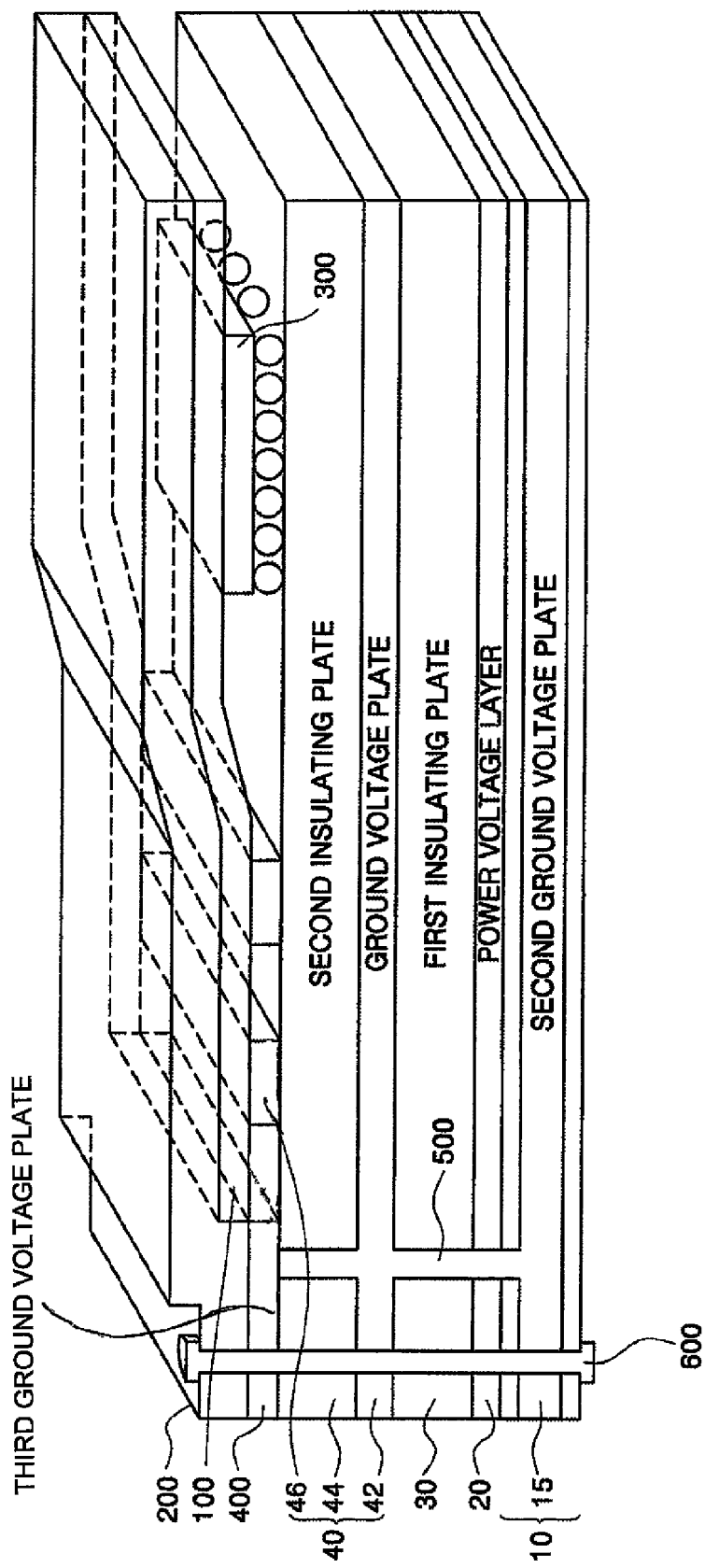
FIG. 5 is a schematic diagram of a third embodiment of a multi-layered PCB according to the present invention.

FIG. 5 illustrates a third embodiment of a multi-layered PCB according to the present invention. The multi-layered PCB of FIG. 5 comprises a circuit board body 10, a power voltage layer 20, a first insulating plate 30, a multi-layered substrate 40, a plurality of active elements 300, thermal interface material 100, a heat sink 200, a third ground voltage plate 400, a clip 600, and a via 500 the multi-layered substrate 40 comprises a first ground voltage plate 42, a second insulating plate 44, and a plurality of signal lines 46. Although three signal lines 46 and a single active element 300 are shown in FIG. 5, the PCB may have four or more signal lines 46 and has two or more active elements 300. The thermal interface material 100 may bond the heat sink 200 to the signal lines and/or to the active elements 300. Also, the PCB has other vias connecting the circuit patterns on the various layers to each other.

The power voltage layer 20, the first insulating plate 30, the multi-layered substrate 40, the signal lines 46, the active elements 300, the thermal interface material 100, and the heat sink 200 are similar to those of the embodiment of FIG. 4. Therefore, these elements will not be described in further detail.

However, unlike the embodiment of FIG. 4, the circuit board body 10 includes a second ground voltage plate 15. Also, the thermal interface material 100 does not extend between the third ground voltage plate 400 and the heat sink 200.

The via 500 is a plug of conductive material, such as copper or aluminum, that fills a hole extending through the multi-layered substrate 40, the first insulating plate 30 and the power voltage layer 20. The via 500 electrically connects the second ground voltage plate 15 to the third ground voltage plate 400. Thus, the third ground voltage plate 400 electrically connects the second ground voltage plate 15 of the circuit board body 10 and the heat sink 200 without the intermediary of thermal interface material 100. Also, the via 500 is electrically connected to the heat sink 200 through the third ground voltage plate 400. Therefore, the heat sink 200 serves as a ground voltage plate. That is, a multi-layered PCB having a strip line is easily realized.

Therefore, the capacitance of the multi-layered substrate 40 is relatively high due to the above-described connection. Therefore, the impedance of the signal lines 46 is relatively low. Also, the electric field is contained such that the circuitry operates stably and signals are transmitted with the high fidelity. If necessary, an additional insulating layer may be disposed on the heat sink 200 to electrically isolate the heat sink 200 from the surrounding environment.

The clip 600 holds the heat sink 200 and the circuit board body 10 together with the third ground voltage plate 400, the first ground voltage plate 42, and the second insulating plate 44 being sandwiched therebetween. Although the clip 600 is illustrated as having the form of a rivet, the clip 600 may have the form of other types of mechanical fasteners. In any case, the clip 600 supplements the bonds by which the thermal interface material 100 secures the heat sink 200 to the signal lines 46 and active elements 300.

As described above, according to the present invention, a multi-layered PCB having a strip line is easily realized using thermal interface material and a heat sink and without the use of an additional ground voltage plate. Thus, signals are transmitted with high fidelity, the impedance of the signal lines is tuned to a precise value, static electricity is readily discharged without the need for a complex circuit dedicated to that end, and electromagnetic interference of signals transmitted through adjacent signal lines is suppressed.

Finally, although the present invention has been described in connection with the preferred embodiments thereof, it is to be understood that the scope of the present invention is not so limited. On the contrary, various modifications of and changes to the preferred embodiments will be apparent to those of ordinary skill in the art. Thus, changes to and modifications of the preferred embodiments may fall within the true spirit and scope of the invention as defined by the appended claims.

What is claimed is:

1. A printed circuit board (PCB), comprising:
a circuit board body;
a multi-layered substrate disposed on the circuit board body, the multi-layered substrate including a plurality of signal lines and a first ground voltage plate interposed between the plurality of signal lines and the circuit board body wherein the circuit board body, signal lines and first ground voltage plate are like those of a PCB having a microstrip line;
thermal interface material disposed directly on the signal lines of the multi-layered substrate; and
a heat sink of electrically conductive material disposed on the thermal interface material,
wherein the heat sink dissipates heat generated by the multi-layered substrate and suppresses electromagnetic interference between signals transmitted through adjacent ones of the plurality of signal lines, the thermal interface material transfers heat from the multi-layered substrate to the heat sink, and the impedance of the plurality of signal lines is tuned by the thermal interface material.

2. The PCB of claim 1, wherein the multi-layered substrate further includes a first insulating plate interposed between the first ground voltage plate and the plurality of signal lines.

3. The PCB of claim 1, wherein the thermal interface material is a silicon-based rubber.

4. The PCB of claim 1, wherein the heat sink consists of a plate of electrically conductive material that extends over the signal lines.

5. The PCB of claim 2, further comprising a plurality of electronic elements disposed on the first insulating plate and electrically connected by the signal lines, and wherein the thickness of the signal lines is different from the thickness of the electronic elements, and the thermal interface material and the heat sink extend over the electronic elements and together have a bend at a boundary between the plurality of signal lines and the plurality of electronic elements.

6. The PCB of claim 5, wherein the circuit board body has a second ground voltage plate, and the PCB further comprises a via electrically connecting the second ground voltage plate of the circuit board body to the heat sink, a third ground voltage plate disposed on the first insulating plate, disposed in contact with the heat sink, and electrically connecting the via and the heat sink, and a fastener coupling the heat sink to the circuit board body with the third ground voltage plate and the multi-layered substrate being sandwiched between the heat sink and the circuit board body.

7. The PCB of claim 5, wherein the heat sink consists of a plate of electrically conductive material that extends over the signal lines and the electronic elements.

8. The PCB of claim 6, wherein the thermal interface material bonds the heat sink to the signal lines and/or the electronic elements.

9. A printed circuit board (PCB), comprising:
a circuit board body;
a multi-layered substrate disposed on the circuit board body, the multi-layered substrate including a plurality of signal lines and a first ground voltage plate interposed between the plurality of signal lines and the circuit board body wherein the circuit board body, signal lines and first ground voltage plate are like those of a PCB having a microstrip line;
thermal interface material disposed directly on the plurality of signal lines of the multi-layered substrate, the thermal interface material having a uniform thickness at least in a region thereof over all of the signal lines; and
a heat sink disposed on the thermal interface material,
wherein the heat sink dissipates heat generated by the multi-layered substrate, the thermal interface material transfers heat from the multi-layered substrate to the heat sink, and the impedance of the plurality of signal lines is tuned by the thermal interface material.

10. The PCB of claim 9, wherein the multi-layered substrate further includes a first insulating plate interposed between the first ground voltage plate and the plurality of signal lines.

11. The PCB of claim 9, wherein the thermal interface material is a silicon-based rubber.

12. The PCB of claim 9, wherein the heat sink consists of a plate of electrically conductive material that extends over the signal lines.

13. The PCB of claim 10, further comprising a plurality of electronic elements disposed on the first insulating plate and electrically connected by the signal lines, and wherein the thickness of the signal lines is different from the thickness of the electronic elements, and the thermal interface material and the heat sink extend over the electronic elements and together have a bend at a boundary between the plurality of signal lines and the plurality of electronic elements.

14. The PCB of claim 13, wherein the circuit board body has a second ground voltage plate, and the PCB further comprises a via electrically connecting the second ground voltage plate of the circuit board body to the heat sink, a third ground voltage plate disposed on the first insulating plate, disposed in contact with the heat sink, and electrically connecting the via and the heat sink, and a fastener coupling the heat sink to the circuit board body with the third ground voltage plate and the multi-layered substrate being sandwiched between the heat sink and the circuit board body.

15. The PCB of claim 13, wherein the heat sink consists of a plate of electrically conductive material that extends over the signal lines and the electronic elements.

16. The PCB of claim 14, wherein the thickness of the thermal interface material is uniform over the signal lines and the electronic elements.

17. The PCB of claim 14, wherein the thermal interface material bonds the heat sink to the signal lines and/or the electronic elements.

* * * * *